US007616141B2

United States Patent
Chen et al.

(10) Patent No.: US 7,616,141 B2
(45) Date of Patent: Nov. 10, 2009

(54) DIGITAL-TO-ANALOG CONVERTER

(76) Inventors: Jianzhong Chen, #585, Blk 608, Clementi West St 1, Singapore, 120608 (SG); Yong Ping Xu, 113 Clementi Rd, Blk D, #03-02, Singapore, 129793 (SG)

( * ) Notice: Subject to any disclaimer, the term of this patent is extended or adjusted under 35 U.S.C. 154(b) by 0 days.

(21) Appl. No.: 11/318,082

(22) Filed: Dec. 23, 2005

(65) Prior Publication Data

US 2007/0279268 A1 Dec. 6, 2007

Related U.S. Application Data

(60) Provisional application No. 60/639,085, filed on Dec. 23, 2004.

(51) Int. Cl.
*H03M 3/00* (2006.01)
(52) U.S. Cl. ........................... 341/143; 341/144

(58) Field of Classification Search .......... 341/143, 341/144, 155; 327/107
See application file for complete search history.

(56) References Cited

U.S. PATENT DOCUMENTS

| | | | | |
|---|---|---|---|---|
| 6,163,787 | A * | 12/2000 | Menkhoff | 708/313 |
| 6,218,972 | B1 * | 4/2001 | Groshong | 341/143 |
| 6,313,774 | B1 * | 11/2001 | Zarubinsky et al. | 341/143 |
| 6,597,208 | B1 * | 7/2003 | Gabet et al. | 327/107 |
| 6,940,434 | B2 * | 9/2005 | Brooks | 341/131 |
| 7,102,426 | B2 * | 9/2006 | Kitamura | 330/10 |
| 2001/0009403 | A1 * | 7/2001 | Huang | 341/143 |
| 2003/0085825 | A1 * | 5/2003 | Jensen et al. | 341/143 |

* cited by examiner

*Primary Examiner*—Jean B Jeanglaude
*Assistant Examiner*—Joseph Lauture
(74) *Attorney, Agent, or Firm*—Schwabe, Williamson & Wyatt, P.C.

(57) ABSTRACT

Embodiments of a digital-to-analog converter are disclosed.

17 Claims, 6 Drawing Sheets

DIGITAL-TO-ANALOG CONVERTER

CLAIM FOR PRIORITY

The current patent application claims priority to U.S. provisional patent application No. 60/639,085, filed on Dec. 23, 2004, titled "Methods for Shaping and Reduction of Digital-to-Analog Converter Noise," assigned to the assignee of the presently claimed subject matter.

FIELD

This disclosure is related to digital-to-analog converters.

BACKGROUND

Digital-to-analog converters, such as, for example, sigma-delta modulators, are subject to errors and/or noise from a variety of sources, including device mismatch.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Due at least in part to device mismatch, monolithic digital-to-analog converters (DACs) may exhibit non-linear characteristics. Thus, a transfer characteristic or transfer function describing conversion from an digital to analog domain may be nonlinear. Such nonlinearities may introduce errors and/or result distortion of an analog signal and may, likewise, degrade performance of a DAC. Nonlinearity, together with other potential noise sources, such as thermal noise, for example, may be considered noise generated inherently. In multi-bit sigma-delta modulator, the digitized signal is converted back to analog domain in the feedback path, typically through an internal DAC, and subsequently subtracted or offset from an input signal. If the feedback signal includes noise, it may degrade performance of the sigma-delta modulator. Thus, advantage attributed to employing multi-bit quantization may be reduced.

Several methods have been proposed to address this issue. They may be divided at a high level into two categories. One may be referred to as an element calibration approach and the other may be referred to as a Dynamic Element Matching (DEM) technique.

In the first category, different methods may be employed depending at least in part on implementation of the DAC. For example, resistor elements may be laser-trimmed in the fabrication, but this may raise cost of manufacture. Current sources may be calibrated by changing the gate voltage or by combining coarse DAC with a fine DAC for calibration. Capacitors may be trimmed by switching in small additional capacitors. However, typically, this method incurs additional chip fabrication cost. In addition, both factory-trimming and calibration at startup may also suffer from element matching variations associated with, for example, age and temperature changes. Periodical or continuous background calibration may be employed; however, circuit complexity and cost may be further increased.

The second category may be referred to as Dynamic Element Matching (DEM). With DEM, integral and differential linearity may be achieved, with modest matching of the components.

Figure 1:
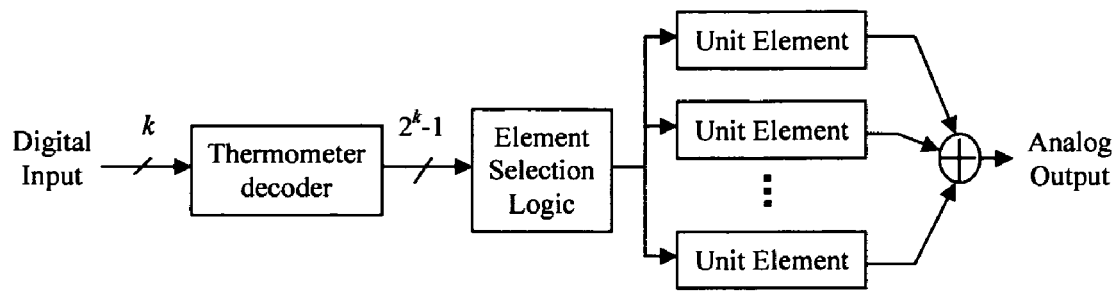
FIG. 1 is a schematic diagram illustrating an embodiment of a k-bit DAC with dynamic element matching.

The principle is illustrated in FIG. 1. A binary input-code of a DAC is transformed into a thermometer-code of $2^k-1$ lines. In a DAC without DEM, these bit lines control one specific unit element of the DAC. Due at least in part to fabrication process variations, the values of these unit elements may not be equal and may introduce nonlinearity errors. If DEM is employed, this one-to-one correspondence may be broken by the element selection block. Hence, the element selecting block selects different unit elements to represent a certain input code. Instead of having a fixed error for this certain input code, in a clock period a time-varying error signal may result. For example, some of the unit elements may have a positive contribution to the error, while others may have a negative contribution. The element selection logic may make this time-varying error signal to average to close to zero over multiple clock periods. The averaged output signal may therefore approaches an ideal output signal. In other words, errors due to component mismatch are "whitened" in a wide frequency band or moved out of signal band. Therefore, error may be removed by filtering, such as via oversampling. An averaged output signal may be a few orders of magnitude better.

An advantage of DEM is that it may work without specific knowledge of the actual mismatch of the unit elements, in contrast to calibration techniques that employ an exact measurement to compensate for errors. Therefore, DEM is, in general, less sensitive to matching variation attributable to age and temperature, for example.

A sigma-delta modulator employing DEM DAC was first reported in L. R. Carley and J. Kenney, "A 16-bit $4^{th}$ order noise-shaping D/A converter", in *Proceeding Custom Integrated Circuit Conference*, June 1988, pp. 21.7.1-21.7.4; and L. R. Carley, "A noise-shaping coder topology for 15+ bit converters", *IEEE Journal of Solid-State Circuits*, vol. 28, no. 2, pp.267-273, April 1989. A three-stage eight-line butterfly randomizer is used to randomly select unit elements. The dc-error and harmonic distortion components in this modulator are spread across the frequency band. Thus, the tone related noise power is reduced, but the noise floor is increased. From applying DEM DAC to sigma-delta modulation, the signal-to-noise-and-distortion Ration (SDNR) is improved with the signal-to-noise Ratio (SNR) is degraded due to the increased noise floor.

Another approach to DEM is the Data Weighted Averaging (DWA). DWA tries to have the elements used with substantially equal probability for a digital input code. This is done by sequentially selecting elements from an array, beginning with the next available unused element. Using elements at a relatively high rate may assist in having DAC errors quickly average to zero, moving distortion to high frequencies. It has been demonstrated that DWA provides first-order shaping of the DAC nonlinear error. A digital dither is employed to whiten the noise so that it may be shaped.

Some modified DWA approaches have also been proposed, among them are the incremental DWA (IDWA), DWA with rotated cycles, and bi-directional data weighted averaging (biDWA). In IDWA, m extra unit elements are added to the DAC such that during a clock cycle at least k unit elements are not used. In this method, the drop in performance near $0.01V_{REF}$ is removed. However, a drop in the SNDR curve now occurs for larger input amplitudes. This shows that the location of the tones is difficult to accurately controlled and in-band tones may still occur. In DWA with rotated cycles, the element access cycles rotate through the elements similar to DWA, but occasionally changes the sequence of the elements. This results in the removal of the tones. However, if the sequence is changed too frequently, performance will be degraded. The hardware implementation for this method is complex. BiDWA is a modified version of DWA. It uses two pointers, one for the even clock cycles and the other for the odd. While the even clock cycles rotate the used elements in one direction, the odd clock cycles rotates in the other direction, unlike DWA that empoys one direction pointer. Compared to DWA, biDWA involves more hardware. The in-band DAC error of biDWA is larger than that of DWA, but the biDWA's DAC error contains no tones or peaks. This results in a worse SNR and SNDR, but a slightly better Spurious Free Dynamic Range (SFDR). BiDWA also suffers from variations of the DAC error versus the signal amplitude similar to DWA.

A second-order low-pass DEM technique, referred to as DWA 02, has also been proposed. This technique has some unit elements contribute multiple times in one clock cycle. To implement this, the clock period is divided into sub-periods. In a sub-period, a specific unit element may have either a positive, negative or zero contribution. Since contributions of the different elements involve a certain time to be integrated within the desired accuracy, the maximum clock speed of the converter may be degraded. Therefore, this technique is typically not suitable for high speed converters. However, it offers a performance improvement over DWA in low speed sigma-delta modulators. The in-band DAC error is typically smaller than that of DWA due to the second-order shaping.

Another DEM approach uses a tree-structure to perform the shuffling operation of the selected unit elements of DAC. The tree-structure for a DAC comprises unit elements and a "tree" shaped switching network formed by multiple sub-switching blocks and used to select these unit elements. A sub-switching block may include a high-pass noise shaping function to generate a control signal for subsequent switching blocks in the network. Therefore, different shaped DAC errors may be achieved by employing different high-pass noise shaping functions, such as first- and second-order noise shaping. The first-order noise shaping with the tree-structure shows similar characteristics and comparable performance as DWA. However, DWA is typically preferred due to less complex hardware for implementation. The second-order noise shaping may potentially be overloaded for large input signals. If overload occurs, second-order noise-shaped DAC can no longer obtained usually.

In summary, DWA seems to offer good performance if DAC nonlinearity error is first-order shaped. Due to its simplicity, it includes an advantage of a small amount of hardware overhead and being suitable for high speed converter. A drawback of DWA is performance degradation if the input signal is near $0.01V_{REF}$. Although this potentially addressed by modified DWA approaches, it usually involves increased hardware complexity.

These DEM approaches are limited in shaping the DAC nonlinearity error at low frequency and, therefore, are typically limited to low-pass sigma-delta ADC. Furthermore, these approaches do not address inherent DAC noise other than nonlinearity, such as thermal noise, for example.

Figure 2:
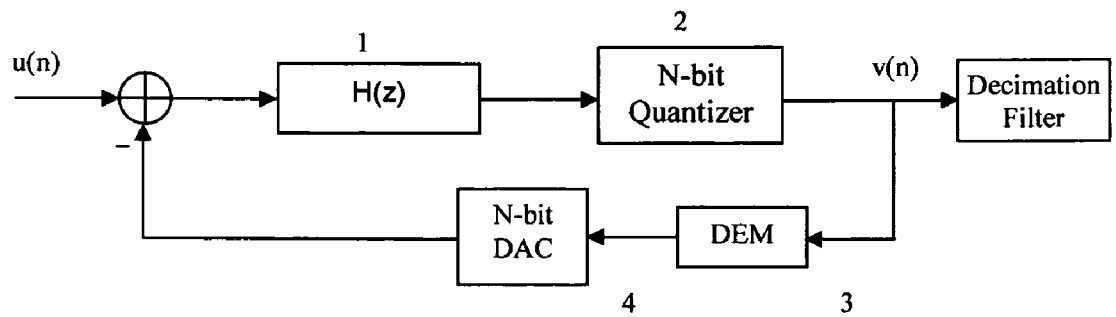
FIG. 2 is a schematic diagram illustrating an embodiment of a multi-bit sigma-delta ADC structure.

FIG. 2 is a schematic diagram illustrating a multi-bit sigma-delta analog-to-digital conversion (ADC) structure. Multi-bit i DAC 4 converts the digital output signal of quantizer 2 to an analog signal. This analog signal may be subtracted from the input signal and passes through a loop filter 1. Quantization noise generated by quantizer 2 may be shaped out of the signal band. However, the DAC noise cannot be shaped and may corrupt the sigma-delta input signal. Hence, the dynamic range of the sigma-delta modulator may be reduced.

Figure 3:
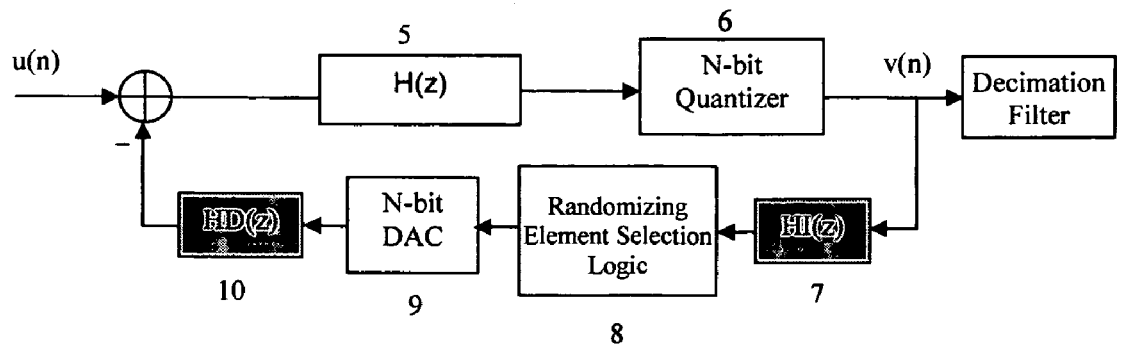
FIG. 3 is a schematic diagram illustrating an embodiment of a sigma-delta ADC with spectrally shaping.

FIG. 3 is a schematic diagram illustrating an embodiment of a possible architecture for a sigma-delta modulator. In FIG. 3, two signal processing blocks, 7 and 10, are inserted in the front of a randomizing element selection logic block 8 and after DAC block 9, respectively. HD(z) 10 is used to shape DAC noise out of signal band. The zeros of HD(z) 10 should be located in the signal band to reduce the in band DAC noise. HI(z) 7 in the digital domain is used to counteract the function of HD(z) 10 in the analog domain. Hence, the modulator output signal may be feedback through DAC 9 without being changed by these additional blocks. Such an embodiment may be employed in low-pass or band-pass sigma-delta modulators by shifting the zeros of HD(z) 10 to the signal band of interest. High-orders of HI(z) 7 and HD(z) 10 may also be employed for better noise shaping effect.

Figure 4:
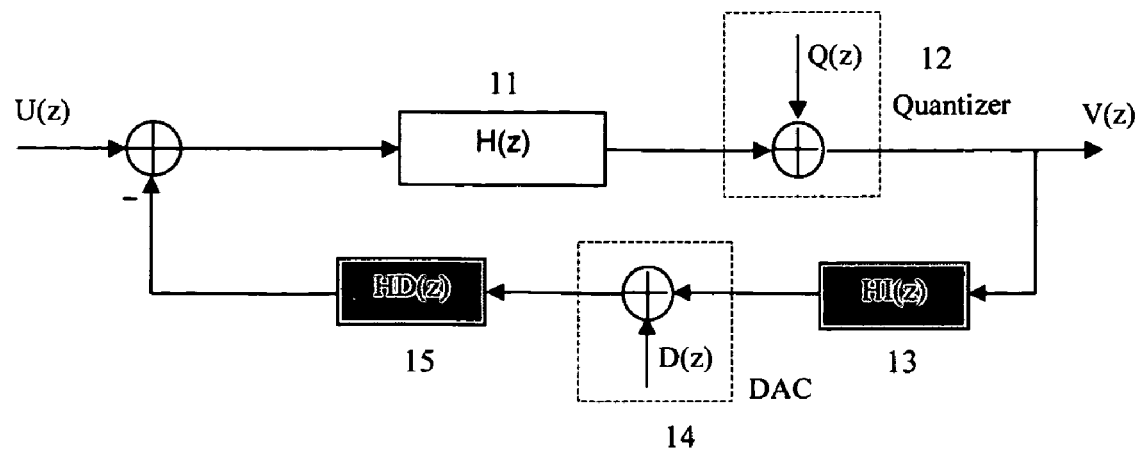
FIG. 4 is a schematic diagram illustrating an embodiment of a sigma-delta modulator linear model.

If DAC nonlinearity error is whitened by randomly selecting the DAC element, a linear model of a sigma-delta modulator may be derived, such as illustrated in FIG. 4, for example. The noise of quantizer 12 and DAC 14, shown here as Q(z) and D(z), are modelled as additive white noise.

For example, the transfer function of the modulator may be expressed as follows:

$$V(z) = \frac{H(z)}{1 + H(z)HI(z)HD(z)}U(z) + \frac{1}{1 + H(z)HI(z)HD(z)}Q(z) - \frac{H(z)HD(z)}{1 + H(z)HI(z)HD(z)}D(z)$$

Likewise, the transfer function of signal U(z) may be expressed as:

$$H_s = \frac{H(z)}{1 + H(z)HI(z)HD(z)}$$

The transfer function of the quantization error may be expressed as:

$$H_Q = \frac{1}{1 + H(z)HI(z)HD(z)}$$

Likewise, the noise transfer function for the DAC may be expressed as:

$$H_D = \frac{-H(z)HD(z)}{1 + H(z)HI(z)HD(z)}$$

If HI(z) 7 and HD(z) 10 cancelled one another, HI(z)HD(z)=1.

Thus, the previous expressions may be rewritten as:

$$V(z) = \frac{H(z)}{1 + H(z)}U(z) + \frac{1}{1 + H(z)}D(z) - \frac{H(z)HD(z)}{1 + H(z)}E(z)$$

$$H_s = \frac{H(z)}{1 + H(z)}$$

$$H_Q = \frac{1}{1 + H(z)}$$

$$H_D = \frac{-H(z)HD(z)}{1 + H(z)}$$

For low-pass sigma-delta ADC, high-pass noise shaping may be applied. Thus, HD(z) may comprise a differentiator, such as one with a transfer function, for example, as:

$$HD_{lp}(z) = 1 - z^{-1}$$

To substantially offset HD(z), HI(z) may comprise an accumulator, such as one with a transfer function, for example, as:

$$HI_{lp}(z) = \frac{1}{1 - z^{-1}}$$

Figure 5:
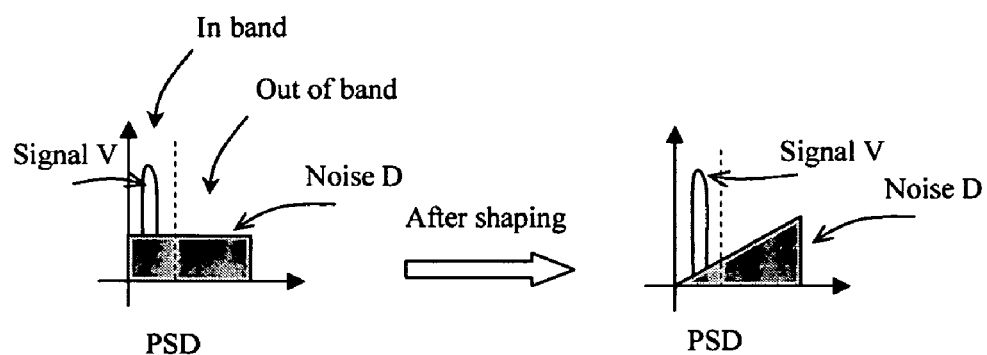
FIG. 5 is a schematic diagram of an embodiment of a DAC with noise shaping.

Here resulting noise shaping is of first order. For simplicity, the zero of HD(z) is placed at dc, though it may be spread to the center of the signal band for better noise shaping effect, for example. FIG. 5 illustrates DAC noise spectrally shaped by such a differentiator for this particular embodiment, although, claimed subject matter is not limited in scope to this example or embodiment, of course.

Figure 6:
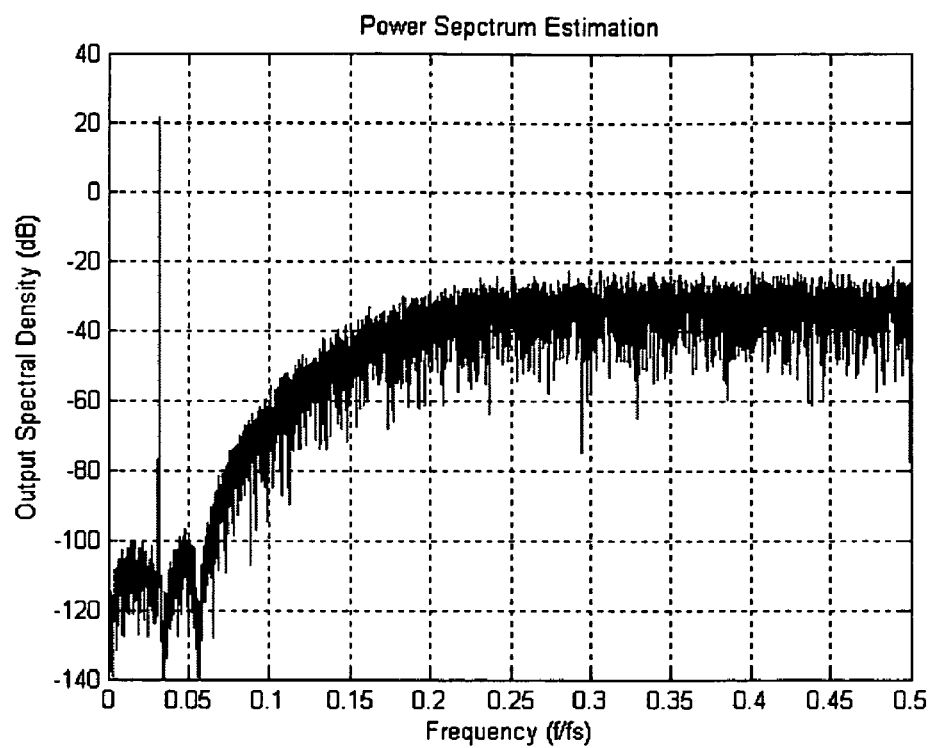
FIG. 6 is a plot of an output power spectral density of a fifth-order 5-bit low-pass sigma-delta modulator with an internal DAC, from simulation.
Figure 7:
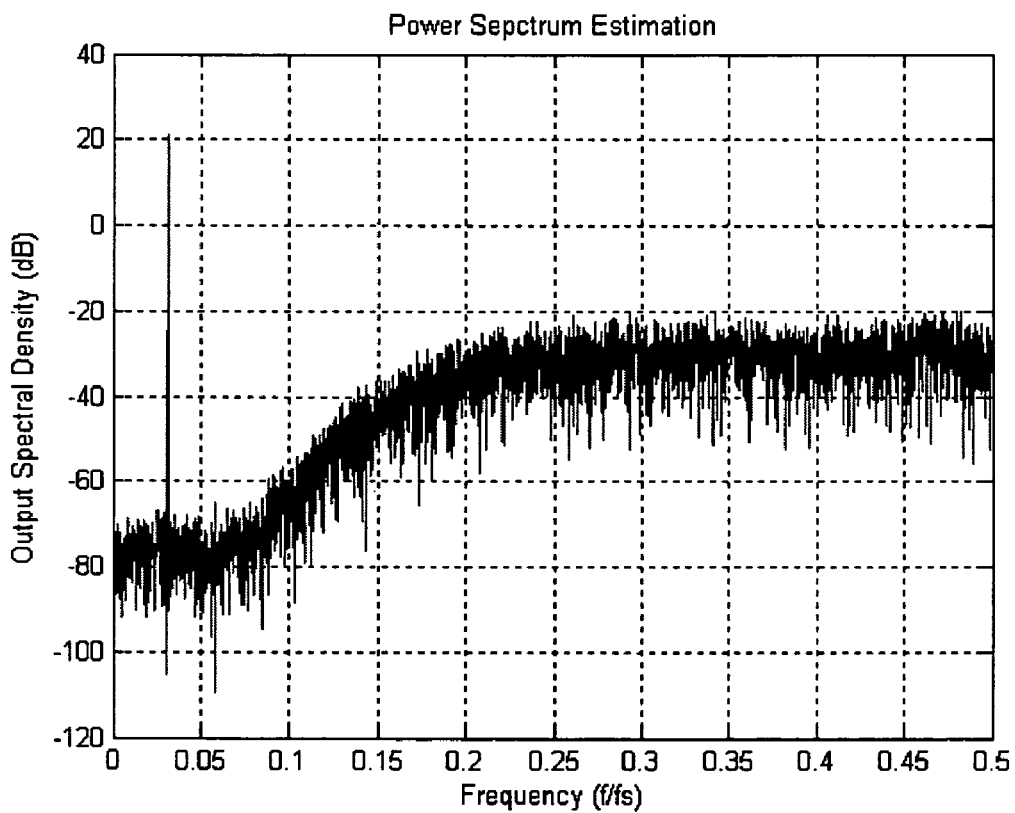
FIG. 7 is a plot of an output power spectral density of a fifth-order 5-bit low-pass sigma-delta modulator with an internal DAC having 2% mismatch, from simulation.
Figure 8:
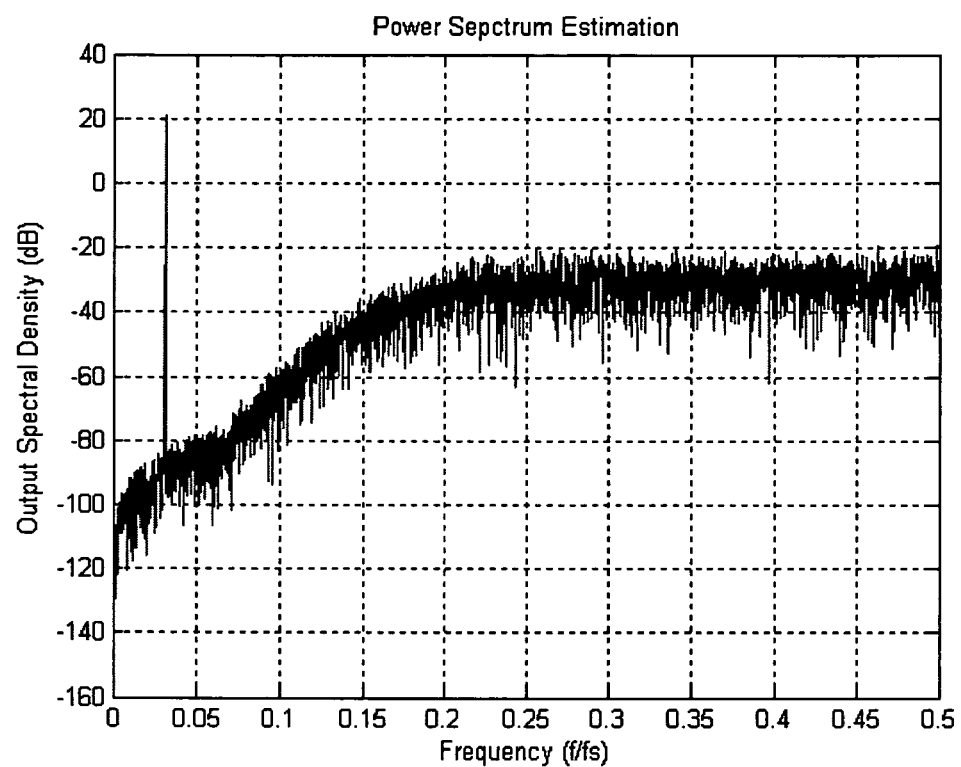
FIG. 8 is a plot of an output power spectrum density of a fifth-order 5-bit low-pass sigma-delta modulator with an internal DAC having 2% mismatch, with an embodiment of spectral shaping applied, from simulation.

Simulation has been employed to model an embodiment in accordance with claimed subject matter. For example, a multi-bit fifth-order low-pass sigma-delta modulator with a 5-bit quantizer and 8-bit DAC is used as an example, although, of course, claimed subject matter is not limited in scope to this particular example. FIG. 6 shows a plot of an output power spectral density (PSD) with a DAC produced by simulation. FIG. 7 a plot of the output PSD with a DAC where 2% mismatch has been included. FIG. 8 shows a plot of the output PSD with the DAC having 2% mismatch, but in which an embodiment of spectral shaping has also been applied. Again, these plots were generated by simulation. Inspection of these plots illustrates performance improvement.

In a situation involving band-pass which a sampling frequency of 4 times of a signal center frequency, $f_s = 4\ f_0$, is employed, a transfer function may be obtained by substituting z with $-z^2$ with respect to $HD_{lp}$ and $HI_{lp}$ in the above mentioned low-pass example.

The resulting HD(z) and HI(z) may be expressed as follows:

$$HI_{bp}(z) = \frac{1}{1 + z^{-2}} \text{ and } HD_{bp}(z) = 1 + z^{-2}$$

Figure 9:
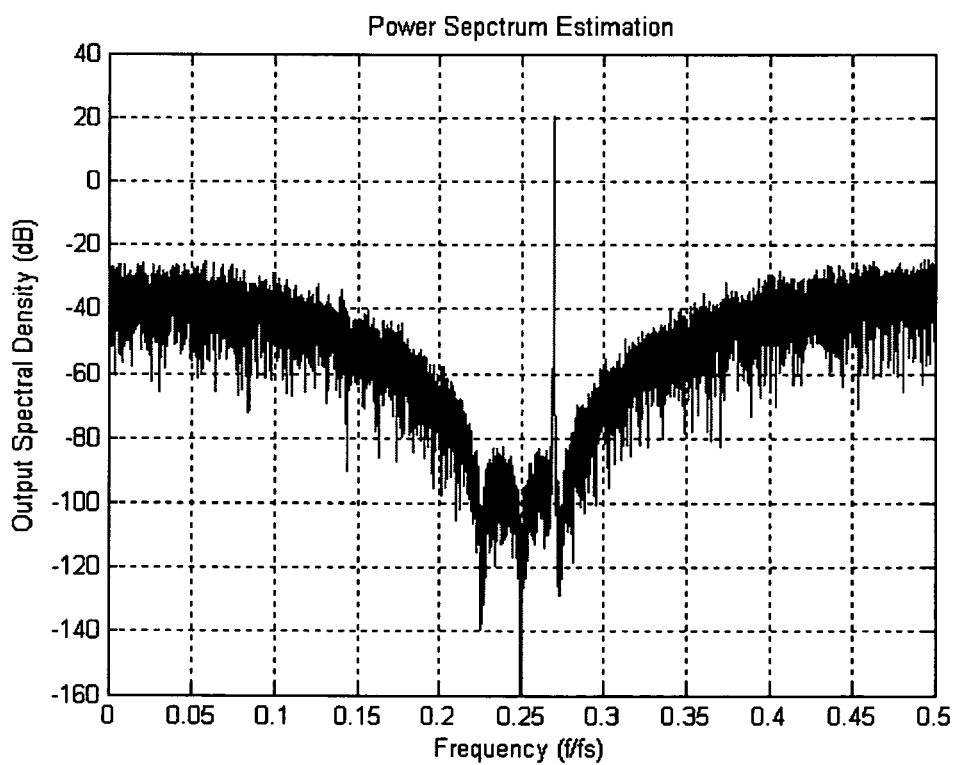
FIG. 9 is a plot of an output power spectral density of a sixth-order 4-bit band-pass sigma-delta modulator with an internal DAC, from simulation.
Figure 10:
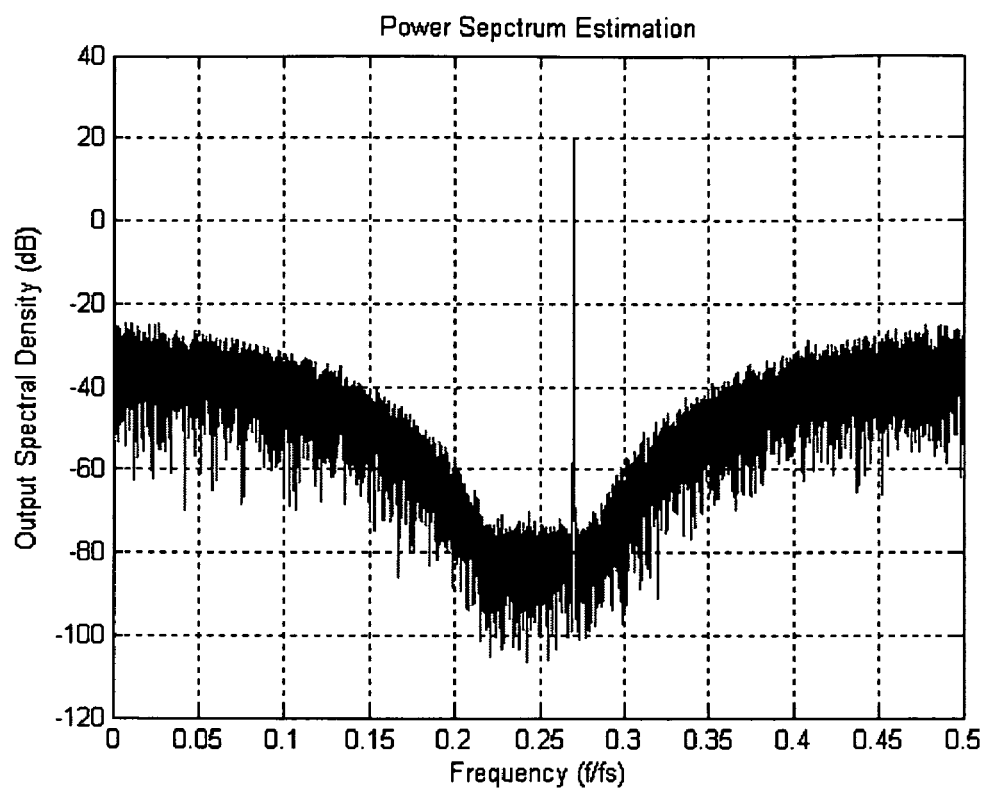
FIG. 10 is a plot of an output power spectral density of a sixth-order 4-bit band-pass sigma-delta modulator with an internal DAC having 2% mismatch, from simulation.
Figure 11:
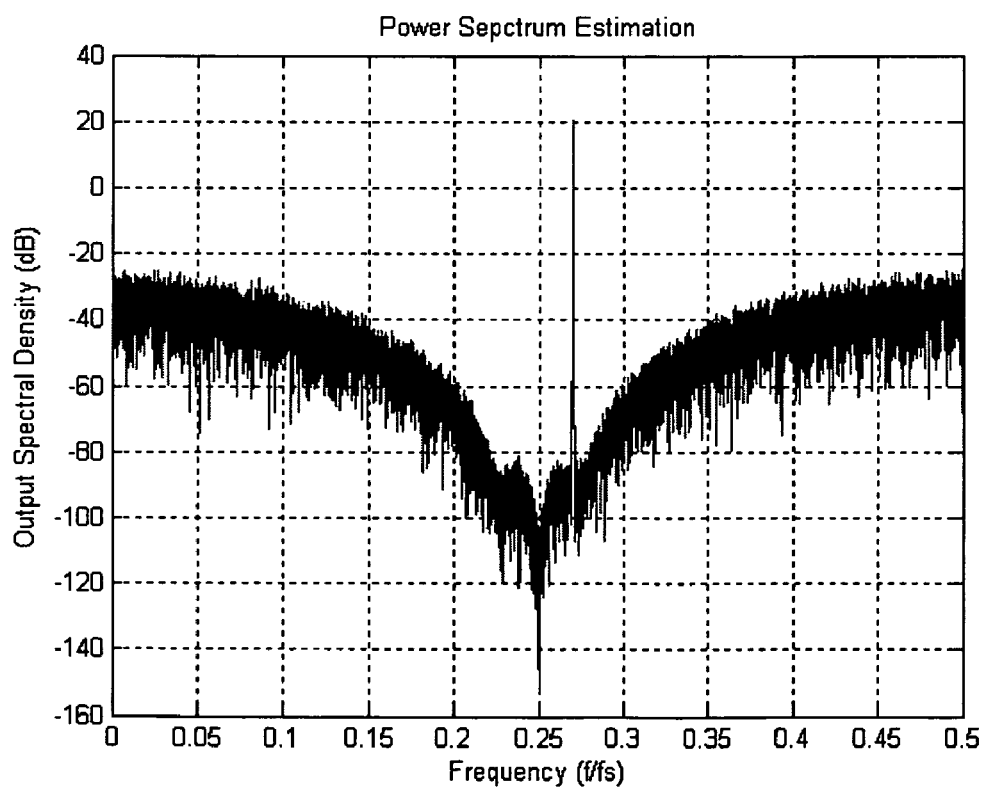
FIG. 11 is a plot of an output power spectral density of a sixth-order 4-bit band-pass sigma-delta modulator with an internal DAC having 2% mismatch, with an embodiment of spectral shaping applied, from Matlab simulation.

Simulation results, for a multi-bit sixth-order band-pass sigma-delta ADC with a 4-bit quantizer and a DAC with DEM, are shown in FIGS. 9 to 11. FIG. 9 shows an output power spectral density (PSD) with a DAC. FIG. 10 shows an output PSD with a DAC having 2% mismatch. FIG. 11 shows an output PSD with a DAC having 2% mismatch, but spectrally shaped via an embodiment in accordance with claimed subject matter.

Figure 12:
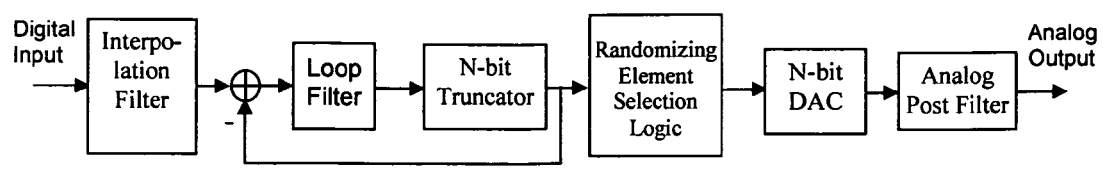
FIG. 12 is a schematic diagram of an embodiment of a multi-bit sigma-delta DAC structure.
Figure 13:
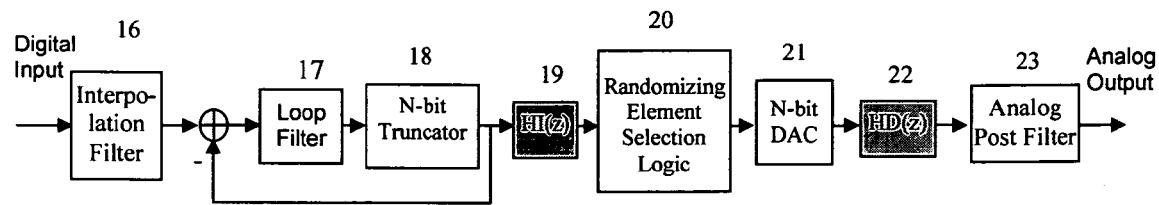
FIG. 13 is a schematic diagram of an embodiment of a sigma-delta DAC with spectral shaping.

In an alternate embodiment, spectral shaping may also be applied to a sigma-delta DAC. FIG. 13 shows an embodiment of a sigma-delta DAC with an embodiment of a noise shaping DAC. HD(z) 22 may be used to shape the DAC noise out of signal band, while HI(z) 19 may be used to offset the function of HD(z), so that the output signal of the DAC would not significantly be affected by the additional blocks, here HD(z) and HI(z). For comparison, FIG. 12 illustrates a multi-bit sigma-delta DAC without these components.

The invention claimed is:

1. A lowpass sigma-delta digital-to-analog converter comprising:
    an interpolation filter for receiving an input and producing an output;
    a summing circuit for receiving the output of said interpolation filter and a feedback signal and producing an output;
    a loop filter receiving the output of said summing circuit as an input and producing an output;
    a truncator receiving the output of said loop filter and producing said feedback signal, an N-bit truncated digital signal, N being an integer with a value greater than one;
    a digital integrator receiving the output of said truncator as an input and producing an output;
    a randomizer block receiving the output of said digital integrator as an input and produce an output;

a digital-to-analog converter receiving said output of said randomizer block as an input and producing an output;

an analog differentiator receiving the output of said digital-to-analog converter as an input and producing an output;

an analog post filter receiving the output of said analog differentiator and producing the output of said lowpass sigma-delta digital-to-analog converter.

2. A lowpass sigma-delta digital-to-analog converter comprising:

an interpolation filter for receiving an input and producing an output;

a summing circuit for receiving the output of said interpolation filter and a feedback signal and producing an output;

a loop filter receiving the output of said summing circuit as an input and producing an output;

a truncator receiving the output of said loop filter and producing said feedback signal, an N-bit truncated digital signal, N being an integer with a value greater than one;

a digital $L^{th}$-order lowpass filter receiving the output of said truncator as an input and producing an output, L being an integer with a value greater than zero;

a randomizer block receiving the output of said digital $L^{th}$-order lowpass filter as an input and produce an output;

a digital-to-analog converter receiving said output of said randomizer block as an input and producing an output;

an analog $L^{th}$-order highpass filter receiving the output of said digital-to-analog converter as an input and producing an output, L being an integer with a value greater than zero;

an analog post filter receiving the output of said analog $L^{th}$-order highpass filter and producing the output of said lowpass sigma-delta digital-to-analog converter.

3. A bandpass sigma-delta digital-to-analog converter comprising:

an interpolation filter for receiving an input and producing an output;

a summing circuit for receiving the output of said interpolation filter and a feedback signal and producing an output;

a loop filter receiving the output of said summing circuit as an input and producing an output;

a truncator receiving the output of said loop filter and producing said feedback signal, an N-bit truncated digital signal, N being an integer with a value greater than one;

a digital $L^{th}$-order bandpass filter receiving the output of said truncator as an input and producing an output, L being an integer with a value greater than zero;

a randomizer block receiving the output of said digital $L^{th}$-order bandpass filter as an input and produce an output;

a digital-to-analog converter receiving said output of said randomizer block as an input and producing an output;

an analog $L^{th}$-order band rejection filter receiving the output of said digital-to-analog converter as an input and producing an output, L being an integer with a value greater than zero;

an analog post filter receiving the output of said analog $L^{th}$-order band rejection filter and producing the output of said bandpass sigma-delta digital-to-analog converter.

4. An apparatus comprising:

a digital-to-analog converter (DAC), disposed in a feedback loop, configured to convert a first quantized digital signal into a first analog signal, wherein the first analog signal is to be subtracted from an input signal to spectrally shape quantization noise out of a signal band;

a differentiator, disposed in the feedback loop and coupled to an output of the DAC, wherein the differentiator is configured with a transfer function to spectrally shape DAC noise out of the signal band; and an accumulator, disposed in the feedback loop and coupled to an input of the DAC, wherein the accumulator is configured with a transfer function which cancels the transfer function of the differentiator to pre-process the first quantized digital signal.

5. The apparatus of claim 4, wherein the differentiator and the accumulator are jointly configured to reduce thermal noise of the DAC introduced into the first analog feedback signal.

6. The apparatus of claim 4, wherein the differentiator is realized with continuous-time circuits.

7. The apparatus of claim 4, wherein the accumulator is realized with discrete-time circuits.

8. The apparatus of claim 4, wherein the accumulator is a digital L'th order lowpass filter, and the differentiator is an analog L'th order highpass filter, wherein L is an integer with a value greater than zero.

9. The apparatus of claim 4, wherein the accumulator is a digital L'th order bandpass filter, and the differentiator is an analog L'th order band rejection filter, wherein L is an integer with a value greater than zero.

10. The apparatus of claim 4, further comprising a randomizer block disposed between the accumulator and the DAC, and configured to compensate for non-linearities of the DAC.

11. The apparatus of claim 10, wherein the randomizer block comprises a plurality of elements to be dynamically and randomly selected for dynamic element matching for the DAC.

12. The apparatus of claim 4, wherein the apparatus is a lowpass modulator.

13. The apparatus of claim 4, wherein the apparatus is a bandpass modulator.

14. The apparatus of claim 4, wherein the apparatus is a highpass modulator.

15. A method comprising:

processing a first quantized digital signal into a second quantized digital signal to complementarily offset subsequent spectral shaping to a first analog signal converted from the the second quantized digital signal to produce a second analog signal;

passing the second quantized digital signal through a randomizer block randomly selecting elements to dynamically element match to pre-compensate for non-linear characteristics of a digital-to-analog conversion process;

converting the pre-compensated second quantized digital signal into the first analog signal; and spectrally shaping the first analog signal into the second analog signal to compensate for noise generated by the converting.

16. The method of claim 15, further comprising subtracting the second analog signal from an input signal to form a modified input signal.

17. The method of claim 16, further comprising filtering the modified input signal, and quantizing the filtered modified input signal to generate the first quantized digital signal.

* * * * *

UNITED STATES PATENT AND TRADEMARK OFFICE
CERTIFICATE OF CORRECTION

PATENT NO. : 7,616,141 B2 Page 1 of 1
APPLICATION NO. : 11/318082
DATED : November 10, 2009
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 82 days.

Signed and Sealed this

Nineteenth Day of October, 2010

David J. Kappos
*Director of the United States Patent and Trademark Office*